United States Patent
Romanovskyy et al.

(10) Patent No.: US 9,685,217 B2
(45) Date of Patent: Jun. 20, 2017

(54) MEMORY DEVICE WITH OVER-REFRESH AND METHOD THEREOF

(71) Applicant: TAIWAN SEMICONDUCTOR MANUFACTURING COMPANY LTD., Hsinchu (TW)

(72) Inventors: Sergiy Romanovskyy, Ottawa (CA); Cormac Michael Oconnell, Ontario (CA)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 137 days.

(21) Appl. No.: 13/947,826

(22) Filed: Jul. 22, 2013

(65) Prior Publication Data

US 2015/0026537 A1  Jan. 22, 2015

(51) Int. Cl.
  *G11C 29/00* (2006.01)
  *G11C 11/406* (2006.01)
  *G06F 11/10* (2006.01)

(52) U.S. Cl.
  CPC .......... *G11C 11/406* (2013.01); *G06F 11/106* (2013.01); *G06F 11/1008* (2013.01); *G06F 11/1048* (2013.01); *G11C 2211/4061* (2013.01)

(58) Field of Classification Search
  CPC ............. G11C 11/406; G11C 11/40611; G11C 2211/4061; G11C 29/08
  USPC ................................. 714/754, 752
  See application file for complete search history.

(56) References Cited

U.S. PATENT DOCUMENTS

| | | | | |
|---|---|---|---|---|
| 4,617,660 A * | 10/1986 | Sakamoto | ........... | G06F 11/1024 714/52 |
| 5,588,112 A * | 12/1996 | Dearth | ................... | G06F 11/106 710/22 |
| 6,166,980 A * | 12/2000 | Chun | ..................... | G11C 11/406 365/222 |
| 6,785,837 B1* | 8/2004 | Kilmer | ................. | G11C 7/1006 714/6.32 |
| 6,853,602 B2* | 2/2005 | Huang | .................. | G11C 11/406 365/189.04 |
| 7,116,602 B2* | 10/2006 | Klein | ................... | G11C 7/1006 365/149 |
| 7,565,479 B2* | 7/2009 | Best | ...................... | G11C 11/406 711/103 |
| 2002/0080657 A1* | 6/2002 | Mine | .................... | G11C 11/406 365/200 |
| 2003/0231540 A1* | 12/2003 | Lazar | ..................... | G11C 11/406 365/222 |
| 2004/0153902 A1* | 8/2004 | Machado | ............ | G06F 11/1068 714/710 |
| 2004/0196718 A1* | 10/2004 | Poechmueller | ....... | G11C 11/406 365/222 |

(Continued)

*Primary Examiner* — Albert Decady
*Assistant Examiner* — Osman M Alshack
(74) *Attorney, Agent, or Firm* — WPAT, P.C., Intellectual Property Attorneys; Anthony King

(57) ABSTRACT

In a method, error detection and correction is performed on output data from a memory cell of a memory device to generate a result of error detection and correction. The memory cell is determined as a weak cell by determining a number of times of data retention failures of the memory cell based on the result of the error detection and correction. In a refreshing cycle, normal cells and the weak cell are refreshed and the weak cell is additionally refreshed at least once.

18 Claims, 13 Drawing Sheets

(56) References Cited

U.S. PATENT DOCUMENTS

| | | | | |
|---|---|---|---|---|
| 2005/0099868 A1* | 5/2005 | Oh | G11C 11/406 | |
| | | | 365/222 | |
| 2007/0041234 A1* | 2/2007 | Nishihara | G11C 11/22 | |
| | | | 365/145 | |
| 2008/0126893 A1* | 5/2008 | Harrand | G11C 7/04 | |
| | | | 714/719 | |
| 2009/0003046 A1* | 1/2009 | Nirschl | G11C 11/5678 | |
| | | | 365/163 | |
| 2012/0300568 A1* | 11/2012 | Park | G11C 11/40618 | |
| | | | 365/222 | |
| 2013/0279284 A1* | 10/2013 | Jeong | G11C 11/402 | |
| | | | 365/222 | |
| 2013/0282973 A1* | 10/2013 | Kim | G11C 11/40622 | |
| | | | 711/106 | |
| 2014/0164874 A1* | 6/2014 | Franceschini | G06F 11/10 | |
| | | | 714/764 | |
| 2014/0269123 A1* | 9/2014 | Kim | G11C 11/40618 | |
| | | | 365/200 | |

* cited by examiner

MEMORY DEVICE WITH OVER-REFRESH AND METHOD THEREOF

TECHNICAL FIELD

The present disclosure is generally related to repairing weak cells in a memory device.

BACKGROUND

Memory devices (e.g., standalone dynamic random access memory (DRAM), embedded DRAM) that store data in a capacitor in a memory cell need to be timely refreshed to restore a charge stored in the capacitor that leaks away in a data retention stage of the memory cell. Due to a non-uniform leakage distribution of memory cells in a memory device, some cells, called "weak" cells, have a higher leakage current than an average leakage current of other cells, called "normal" cells, and fail to retain data at the same refresh rate as that of other cells. In order to eliminate read errors, the weak cells found during testing of the memory device are repaired. Moreover, throughout the life time of the memory device, some cells that perform normally under the refresh rate set initially during the testing of the memory device may eventually degrade and become weak cells that need to be repaired.

One approach to repair the weak cells is to select a refresh rate sufficiently high to compensate for both the average leakage current in the average cells and the higher leakage current in the weak cells. Unfortunately, this approach causes increase of overall refresh current of the memory device and significant increase of power consumption, and reduces a bandwidth for accessing the memory device.

Another approach to repair the weak cells involves identifying weak cells and repairing them by assigning spare rows or columns to replace the rows or columns containing the weak cells. For this approach, the refresh rate can be set in accordance with the average leakage current in the average cells. However, it is too costly to repair, for example, one weak cell in a memory block with a whole spare row or column, and, if a weak cell again appears in the spare row or column, another spare row or column needs to be allocated for repairing the weak cell in the spare row or column, and therefore, double resources are used to fix one weak cell in the memory block.

For weak cells that appear throughout the life time of the memory device, the above-mentioned approaches are even more uneconomical because increasing the overall refresh rate causes a significant percentage of increase in power consumption in view of the percentage of power consumption of the weak cells, and setting aside double spare rows or columns for each possible occurrence of weak cell results in a significant percentage increase in area in view of the percentage of area of the weak cells.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
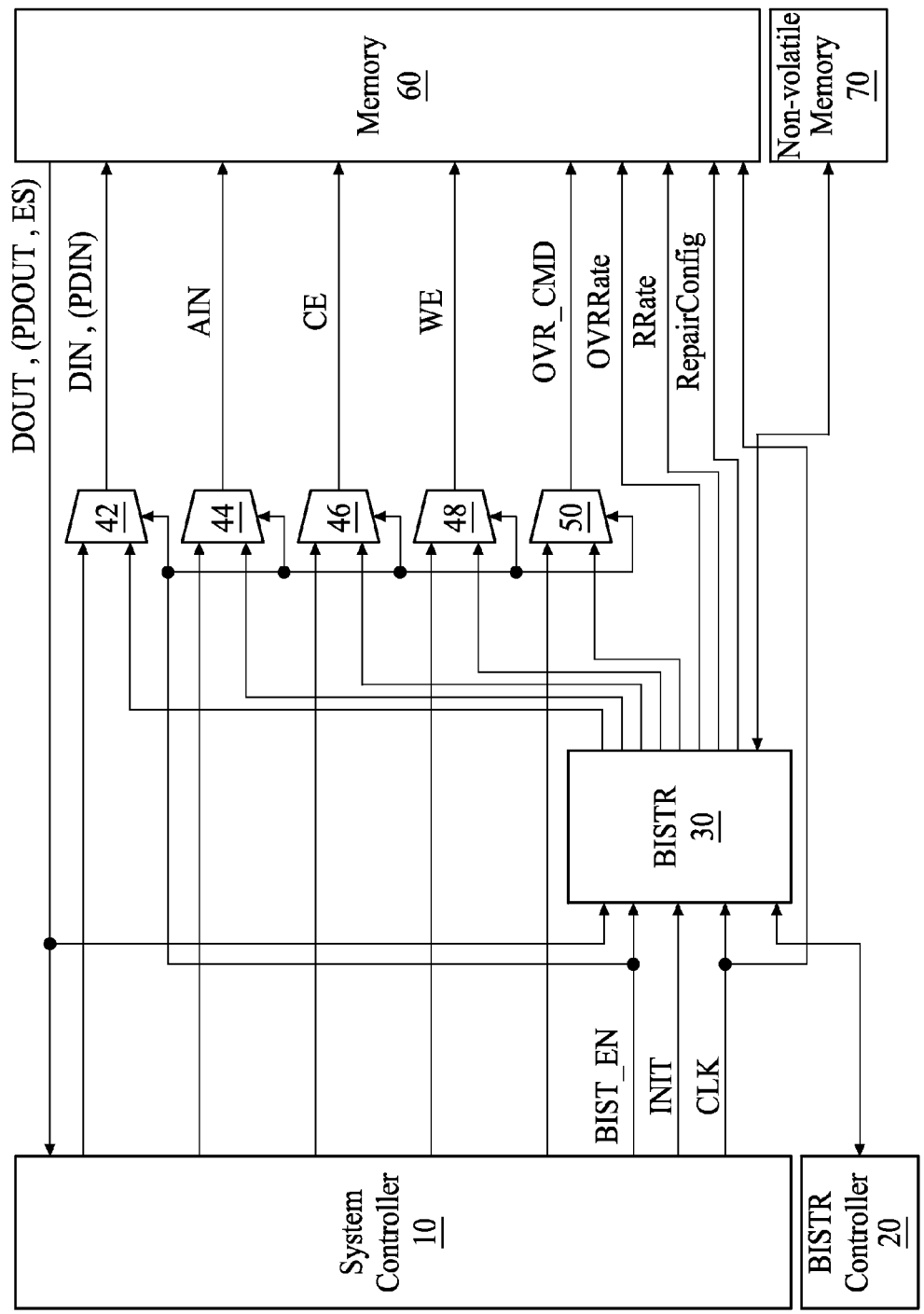
FIG. 1 is a block diagram of a system for repairing memory cells in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

System for Repairing Memory Cells

FIG. 1 is a block diagram of a system 1 for repairing memory cells in accordance with some embodiments. In FIG. 1, the system 1 includes a system controller 10, a built-in self-test and repair (BISTR) controller 20, a BISTR device 30, a plurality of multiplexers 42, 44, 46, 48, 50, a memory device 60 and a non-volatile memory 70. The system 1 is a system-on-a-chip (SOC) and the memory device 60 is an embedded dynamic random access memory (eDRAM). Alternatively, the system 1 is a standalone DRAM system or other systems applicable to the description of the present disclosure. The BISTR device 30 and the memory device 60 operate under the clock signal CLK sent by the system controller 10. The memory device 60 receives input data DIN, an input address AIN, a chip enable signal CE, a write enable signal WE, an over-refresh command signal OVR_CMD, an over-refresh rate OVRRate, a refresh rate RRate, a repair configuration RepairConfig from the BISTR device 30 or the system controller 10 selected by the multiplexers 42, 44, 46, 48, 50 in response to a BISTR enable signal BIST_EN sent by the system controller 10. The BISTR enable signal BIST_EN also enables the BISTR device 30. During testing of the memory device 60, the memory device 60 sends data stored in the memory device 60 as output data DOUT to the BISTR device 30. For detection and correction of errors from weak cells occur throughout the life time of the memory device 60, the memory device 60 or the system controller 10 is equipped with an error correction code (ECC) correction capability to detect and correct errors by encoding and decoding data input to the memory device 60 and data stored in the memory device 60, respectively. If error detection and correction is performed internally to the memory device 60, the memory device 60 sends corrected output data DOUT to the system controller 10 and for weak cells to be identified, parity bits PDOUT and a result of the error detection and correction, for example, an error detection status ES is sent to the system controller 10. If error detection and correction is performed by the system controller 10 external to the memory device 60, the system controller 10 has identified weak cells. As a result, in some embodiments, the memory device 60 receives corrected input data DIN and parity bits PDIN from the system controller 10, stores the corrected input data DIN and the parity bits PDIN, and outputs the corrected output data DOUT and parity bits PDOUT to the system controller 10. The parity bits PDIN stored into the memory device 60 and the parity bits PDOUT read from the memory device 60 are the same. For illustration purposes, the parity bits are used for error correction and detection. Other error correction codes are within the contemplated scope of the present disclosure. The BISTR device 30 is coupled to the BISTR controller 20 and the non-volatile memory 70 to perform testing and repairing as described below. In some embodiments, the BISTR device 30 detects and corrects errors when the BISTR device 130 receives data which are not corrected by ECC logic.

During a testing stage of the memory device 60, the BISTR device 30 is programmed by the BISTR controller 20 to perform various tests on the memory device 60 in order to identify weak cells of the memory device 60. Upon assertion of the BISTR enable signal BIST_EN, the BISTR device 30 controls the memory device 60 to perform write and read operations with generated test data sequences and address sequences by asserting the chip enable signal CE and asserting or deasserting the write enable signal WE for corresponding write or read operations. The BISTR device 30 also configures the memory device 60 to refresh at the refresh rate RRate. Under this refresh rate RRate, weak cells in the memory device 60 that fail to retain data are identified, and the BISTR device 30 begins a repairing stage.

During the repairing stage of the memory device 60, the BISTR device 30 has options to repair the weak cells with spare rows and columns for replacing the weak cells and to repair the weak cells by refreshing the weak cells more often than other cells of the memory device 60 that are refreshed at the refresh rate RRate. For illustration, refreshing weak cells more often than other cells is called over-refreshing. The repair configuration RepairConfig can be set for either option. In order to over-refresh the weak cells, the BISTR device 30 notifies the memory device 60 to extract the addresses of the weak cells by asserting the over-refresh command signal OVR_CMD. The over-refresh rate OVR-Rate for controlling the number of times that the weak cells are refreshed in a refreshing cycle can be increased if needed. If the weak cells are repaired, the refresh rate RRate is reduced and testing and repairing can be iteratively performed by the BISTR device 30 until an optimized refresh rate RRate and over-refresh rate OVRRate are obtained. The addresses of the weak cells under such refresh rate RRate and over-refresh rate OVRRate, as well as the refresh rate RRate and the over-refresh rate OVRRate themselves, are stored into the non-volatile memory 70. Every time the memory device 60 is powered up, the information for refreshing the memory device 60 is retrieved by the BISTR device 30 in response to the INIT signal sent by the system controller 10.

Throughout the life time of the memory device 60, some cells that retain data successfully under the refresh rate RRate and the over-refresh rate OVRRate set during testing of the memory device 60 may degrade and fail to retain data later when the memory device 60 is in use. Such failures can be captured by the system controller 10, or by the BISTR device 30, through monitoring the error detection status ES from the error detection and correction, and the addresses of the faulty bits can be identified using parity bits PDOUT and a result of the error detection and correction including, for example, the error detection status ES. The system controller 10 keeps track of the number of times that a memory cell fails and decides if this memory cell is to be classified as a weak cell. In some embodiments, the information of the weak cell is stored in, for example, the non-volatile memory 70, and is downloaded by the system controller 10 each time the memory device 60 is powered up. Alternatively, detecting weak cells using the error detection and correction is performed by the system controller 10 each time the memory device 60 is powered up.

In some embodiments, the weak cells identified when the memory device 60 is in use are repaired using in-field repair and over-refreshing. The system controller 10 asserts the chip enable signal CE and write enable signal WE to control the memory device 60 to perform in-field repair by writing back corrected data from the error detection and correction. Also, the system controller 10 notifies the memory device 60 to extract the addresses of the weak cells for over-refreshing the weak cells by asserting the over-refresh command signal OVR_CMD.

Embodiments of Memory Device

Figure 2:
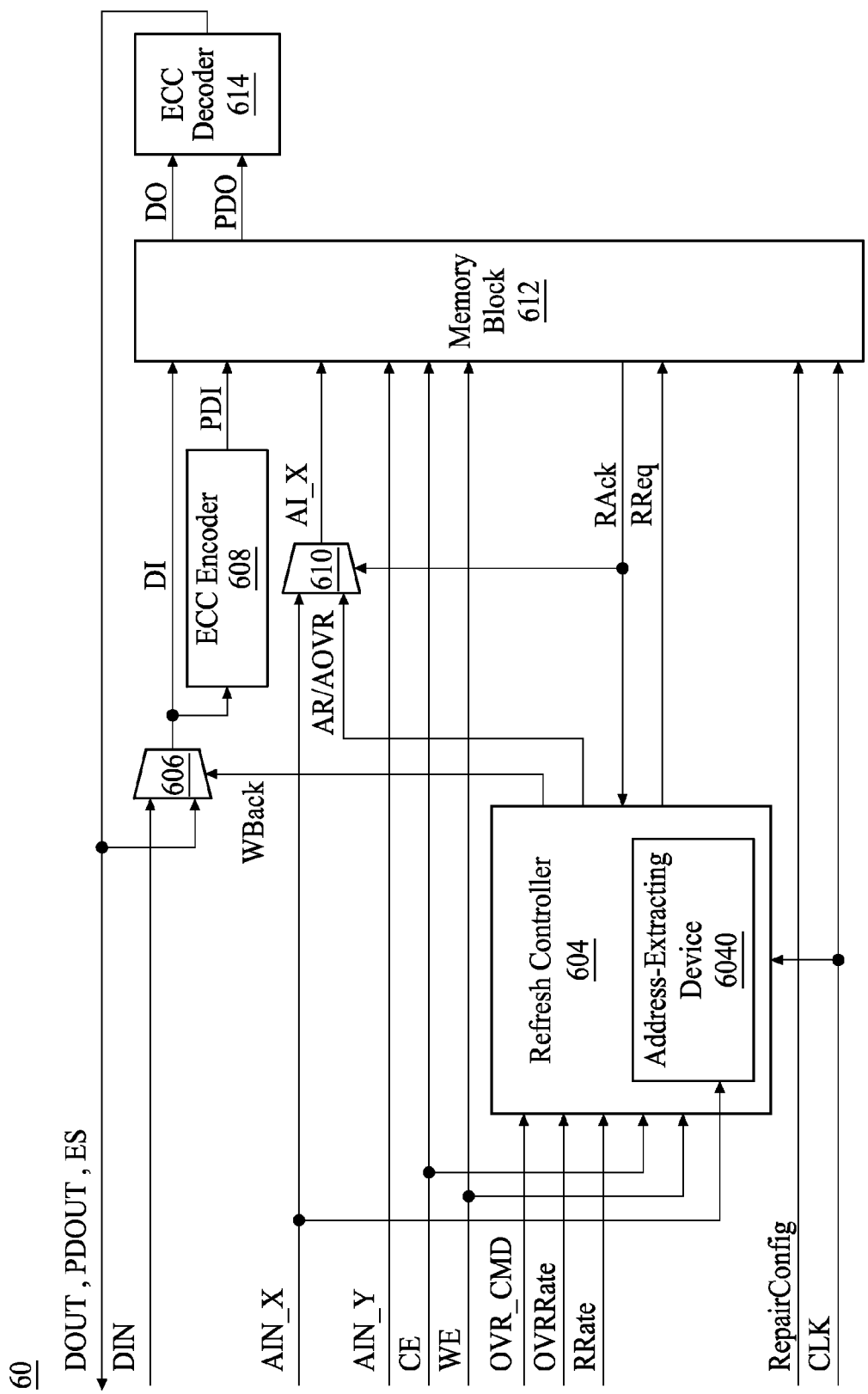
FIG. 2 is a block diagram of a memory device in accordance with some embodiments.

FIG. 2 is a block diagram of the memory device 60 in accordance with some embodiments. In FIG. 2, the memory device 60 includes a memory block 612, a refresh controller 604, a first multiplexer 610, an ECC encoder 608 and an ECC decoder 614 and a second multiplexer 606. The refresh controller 604 includes an address-extracting device 6040. During a regular read or write operation, the refresh controller 604 sends a deasserted refresh request signal RReq to the memory block 612, and, in response, the memory block 612 deasserts the refresh acknowledge signal RAck, whereby the first multiplexer 610 selects a row address part AIN_X of the input address AIN in FIG. 1 as an input row address AI_X to the memory device 60. During a refreshing operation, the refresh controller 604 sends an asserted refresh request signal RReq to the memory block 612, and, in response, when the memory block 612 is not being occupied by a regular read or write operation the memory block 612 asserts the refresh acknowledge signal RAck, whereby the first multiplexer 610 selects a row address AR of any row in the memory block 612 to be refreshed once in a refreshing cycle or a row address AOVR of a row containing a weak cell to be refreshed additionally in the refreshing cycle as the input row address AI_X to the memory block 612. The refresh request signal RReq, in some embodiments, is asserted at a frequency in accordance with the refresh rate RRate. The refresh acknowledge signal RAck in response to the refresh request signal RReq indicates that the memory device 60 is performing refreshing. In some embodiments, refreshing is done on a row-by-row basis. When refreshing is performed, the refresh controller 604 provides the row addresses AR of the memory block 612 row by row to the memory block 612 in a refreshing cycle. For a weak cell that fails data retention under the refresh rate RRate identified during testing or when the memory device 60 is in use as described above, a row address AOVR of the weak cell in the memory block 612 is extracted by the address-extracting device 6040. The row address AOVR is extracted by the address extracting device 6040 controlled by the refresh controller 604 when the over-refresh command signal OVR_CMD is asserted. The respective row address AOVR of each weak cell is stored in the refresh controller 604. The refresh controller 604 provides the row address AOVR of the weak cell to the memory block 612 P times additionally in the refreshing cycle, wherein P is equal to the over-refresh rate OVRRate and is an integer greater than or equal to 1.

The memory block 612 receives input data DI from the input data DIN to the memory device 60 or a corrected data DOUT from the ECC decoder 614 selected by the second multiplexer 606 in response to a write back signal WBack. The write back signal WBack is sent by the refresh controller 604 in response to the over-refresh command signal OVR_CMD, the chip enable signal CE and the write enable signal WE for writing a corrected datum contained in DOUT from the error detection and correction back to the weak cell. In order to generate the corrected data DOUT, the ECC encoder 608 generates parity bits PDI based on the input data DI and store the input data DI and the parity bits PDI in the memory block 612. The ECC decoder 614 receives output data DO and parity bits PDO from the memory block 612, and generates the corrected data DOUT, as well as a result of the error detection and correction including, for example, an error detection status ES. Signals for writing back the corrected data to the memory block 612 also include a column address AIN_Y of the weak cell, the chip enable signal CE and write enable signal WE.

As described above, during testing, the BISTR device 30 in FIG. 1 starts an iteration for setting the refresh rate RRate and the over refresh rate OVRRate with the testing stage to identify failure bits under such rates, and finish the iteration with a repairing stage to repair the failure bits using, for example, over-refreshing. During the repairing stage of the memory device 60, if over-refreshing is used, the BISTR device 30 notifies the refresh controller 604 to control the address-extracting device 6040 to extract the row address AIN_X of a weak cell by asserting the over-refresh command signal OVR_CMD. The row address AIN_X is valid when the over-refresh command signal OVR_CMD is asserted. Once extracted, the weak cell is over-refreshed between regular refreshing operations of the weak cell. Also, in the clock cycle when the over-refresh command signal OVR_CMD is asserted, no writing back of corrected data from the error detection and correction is used because during the testing, test data sequences may be generated each time before read or write operations are performed on the memory device 60. Therefore, during the repairing stage, when the over-refresh command signal OVR_CMD is asserted, the chip enable signal CE and write enable signal WE for read or write operations stay deasserted.

In addition, each time the memory device 60 is powered up and before operation of the memory device 60, the BISTR device 30 notifies the refresh controller 604 to control the address-extracting device 6040 to extract the row address AIN_X of a weak cell detected during testing of the memory device 60 by asserting the over-refresh command signal OVR_CMD. In some embodiments, writing back corrected data from the error detection and correction is not used. Hence, each time the memory device 60 is powered up and before operation of the memory device 60, when the over-refresh command signal OVR_CMD is asserted, the chip enable signal CE and write enable signal WE for read or write operations stay deasserted.

Figure 3:
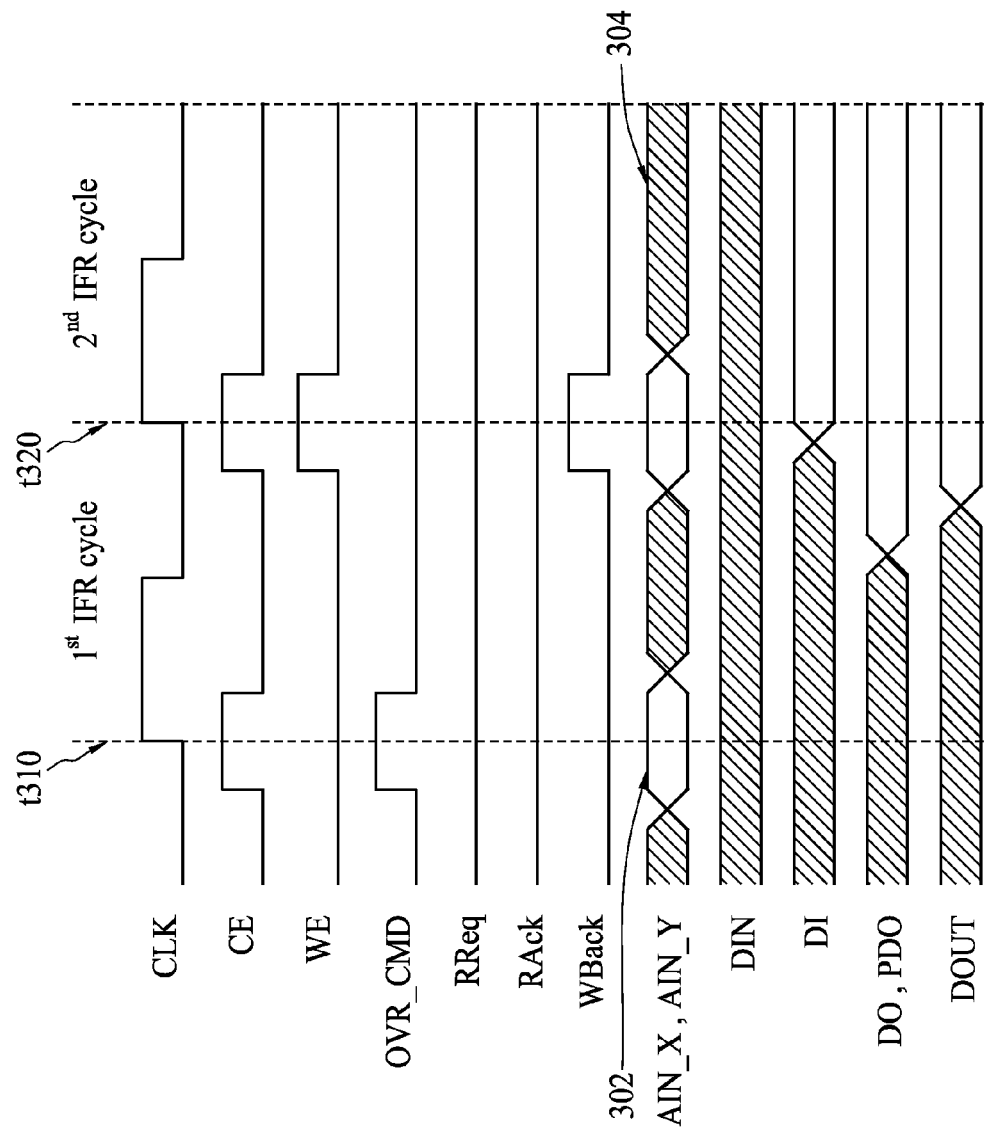
FIG. 3 is a timing diagram illustrating signals during an in-field repair of the memory device with internal error detection and correction in accordance with some embodiments.

FIG. 3 is a timing diagram illustrating signals during an in-field repair (IFR) of the memory device 60 in FIG. 2 with internal error detection and correction in accordance with some embodiments. In the illustration of FIG. 3, two clock cycles, a first IFR cycle and a second IFR cycle, are used to complete an in-field repair of a weak cell. The first cycle involves reading data including a datum stored in a weak cell of the memory block 612, and extracting a row address of the weak cell, and the second cycle is to write back the data after error correction.

In FIG. 3, the memory device 60 is under the control of the system controller 10 in FIG. 1. In the first IFR cycle, a read operation to read data including a datum stored in the weak cell and an extraction of a row address for over-refreshing the weak cell are performed. At a time t310, to initiate the first IFR cycle, the chip enable signal CE is asserted, and the write enable signal WE is deasserted. The refresh acknowledge signal RAck is deasserted for the memory block 612 to perform the read operation at the address (AIN_X, AIN_Y). The address (AIN_X, AIN_Y) is valid at the time t310. In FIG. 3, the blank portion 302 shown in the address (AIN_X, AIN_Y) indicates that the values are valid and the shaded portion 304 indicates the values are in a "don't care" state, i.e., the address (AIN_X, AIN_Y) can be any value without affecting the current operation of the memory device 60. Then, the datum contained in the output data DO stored in the weak cell and the associated parity bits PDO are available and provided to the ECC decoder 614 in FIG. 2. Additionally, the ECC decoder 614 generates the corrected data DOUT. The over-refresh command signal OVR_CMD is asserted so that the refresh controller 604 controls the address-extracting device 6040 to extract the row address AIN_X of the weak cell and over-refreshing can be performed on the weak cell after the corrected datum is written back in the second IFR cycle.

In the second IFR cycle, a write operation to write the corrected datum back into the weak cell is performed. At a time t320, to initiate the second IFR cycle, the chip enable signal CE is asserted, the write enable signal WE is asserted and the refresh acknowledge signal RAck is deasserted for the memory block 612 to perform the write operation at the address (AIN_X, AIN_Y). The write back signal WBack is asserted for the corrected datum contained in the corrected data DOUT to be selected for writing back to the weak cell. In some other embodiments, the over-refresh command signal OVR_CMD is asserted at time t320 instead of at the time t310. In still some other embodiments, the over-refresh command signal OVR_CMD is asserted at the time t310 and the refresh acknowledge signal RAck is asserted at the time t320 to use a row address AOVR extracted to write back the corrected datum.

For the in-field repair illustrated in FIG. 3, writing back corrected datum contained in DOUT involves the chip enable signal CE, the write enable signal WE, the write back signal WBack, the address (AIN_X, AIN_Y), and the corrected data DOUT. The corrected data DOUT is derived from the external input data DIN, the input data DI to the memory block 612 in FIG. 2, the output data DO and the parity bits PDO from the memory block 612. Extracting a row address AIN_X of a weak cell involves the over-refresh command signal OVR_CMD, and the row address AIN_X. In some embodiments, the refresh request signal RReq and the refresh acknowledge signal RAck stay deasserted.

Figure 4:
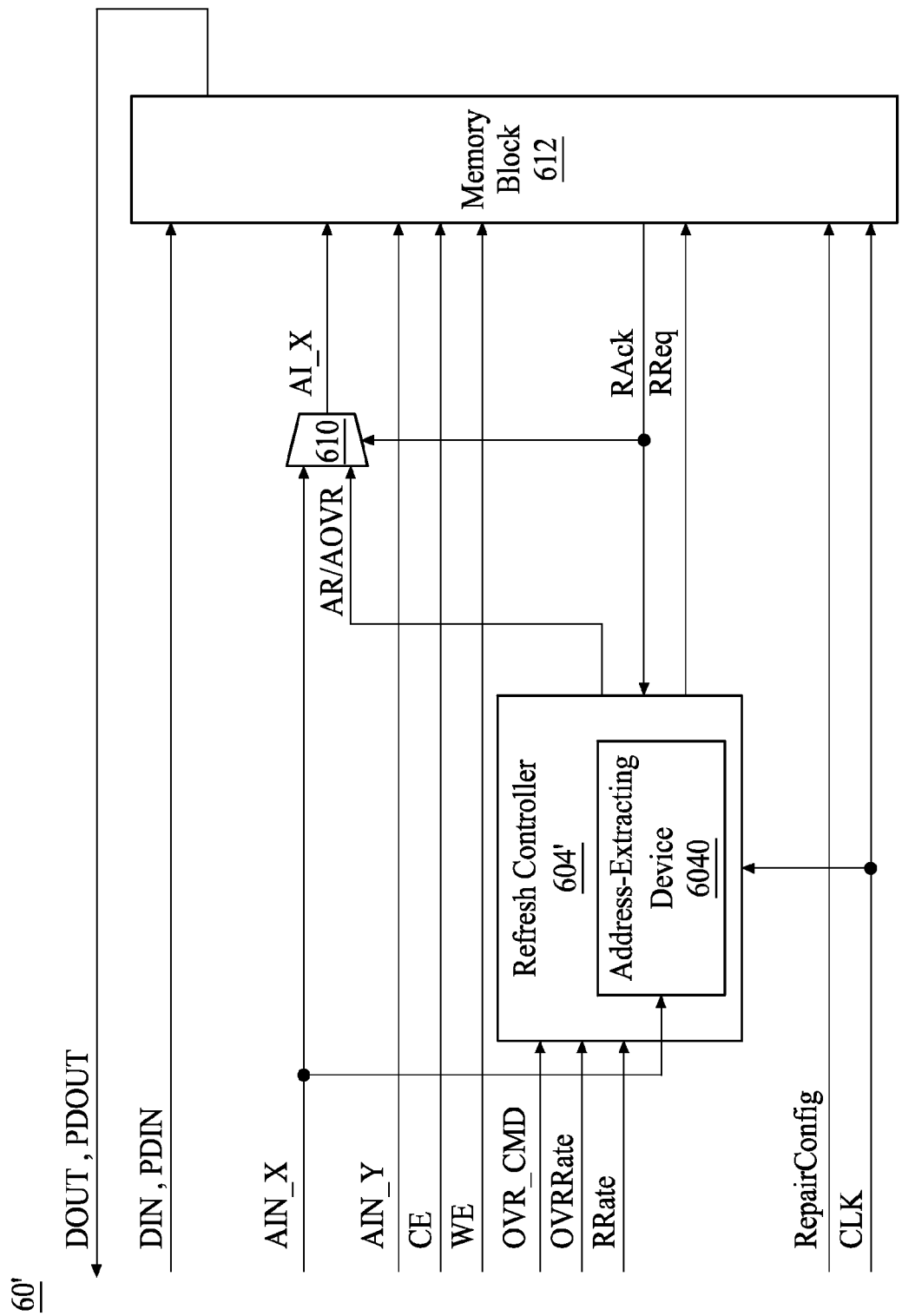
FIG. 4 is a block diagram of a memory device in accordance with some embodiments.

FIG. 4 is a block diagram of a memory device 60' in accordance with some embodiments. Operations with reference to memory device 60' are different from those of memory device 60 in FIG. 2 in that error detection and correction is performed by the system controller 10 in FIG. 1 and takes place external to the memory device 60'. The system controller 10 performs reading of the data and the parity bits stored in the memory block 612 through DOUT and PDOUT for the error detection and correction and writing back of corrected data and the parity bits through DIN and PDIN separate in time. Therefore, by the time data is written back, the corrected data have been provided as the external input data DIN by the system controller 10. Other components of memory device 60' are configured the same as those of memory device 60 in FIG. 2, and descriptions thereof are therefore omitted.

The operations of the memory device 60' under the control of the BISTR device 30 in FIG. 1 during testing of the memory device 60', or after power-up and before operation of the memory device 60' are the same as those for the memory device 60 in FIG. 2 and are therefore omitted.

Figure 5:
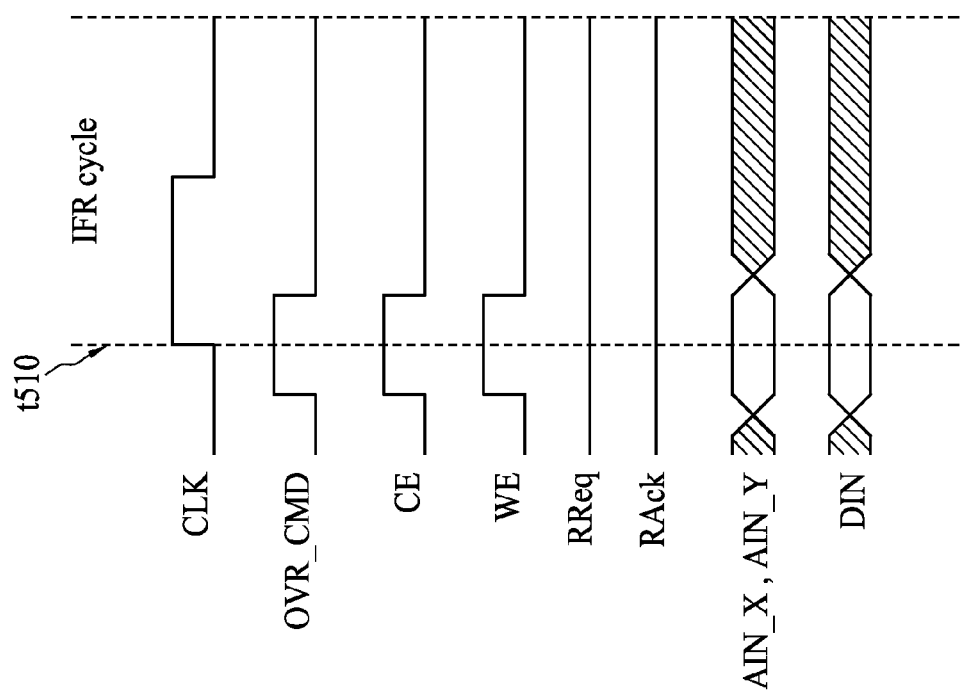
FIG. 5 is a timing diagram illustrating signals during an in-field repair of the memory device with external error detection and correction in accordance with some embodiments.

FIG. 5 is a timing diagram illustrating signals during an in-field repair of the memory device 60' with external error detection and correction in accordance with some embodiments. In this illustration, one clock cycle, an IFR cycle, is used to complete an in-field repair of the weak cell, and is involved with writing back a corrected datum from the error detection and correction and extracting a row address of the weak cell.

In FIG. 5, the memory device 60' is under the control of the system controller 10. In the IFR cycle, the corrected datum is written back to the weak cell and a row address for over-refreshing the weak cell is extracted. At the time t510, to initiate the IFR cycle, the chip enable signal CE is asserted, the write enable signal WE is asserted, and the refresh acknowledge signal RAck is deasserted for the memory block 612 to perform the write operation at the address (AIN_X, AIN_Y). The corrected datum is obtained from the input data DIN. The address (AIN_X, AIN_Y) is valid at the time t510. The over-refresh command signal OVR_CMD is asserted so that the refresh controller 604 controls the address-extracting device 6040 to extract the row address AIN_X of the weak cell and over-refresh can be performed after the corrected datum is written back.

For in-field repair as shown in FIG. 5, writing back corrected datum contained in DIN involves the chip enable signal CE, the write enable signal WE and the address (AIN_X, AIN_Y). Extracting a row address AIN_X of a weak cell involves the over-refresh command signal OVR_CMD, and the row address AIN_X. In some embodiments, the refresh request signal RReq and the refresh acknowledge signal RAck stay deasserted. Further, there is no read operation one cycle before the write back operation in the embodiment in FIG. 5 in contrast to the embodiment in FIG. 3.

Refreshing/Over-Refreshing

Figure 6A:
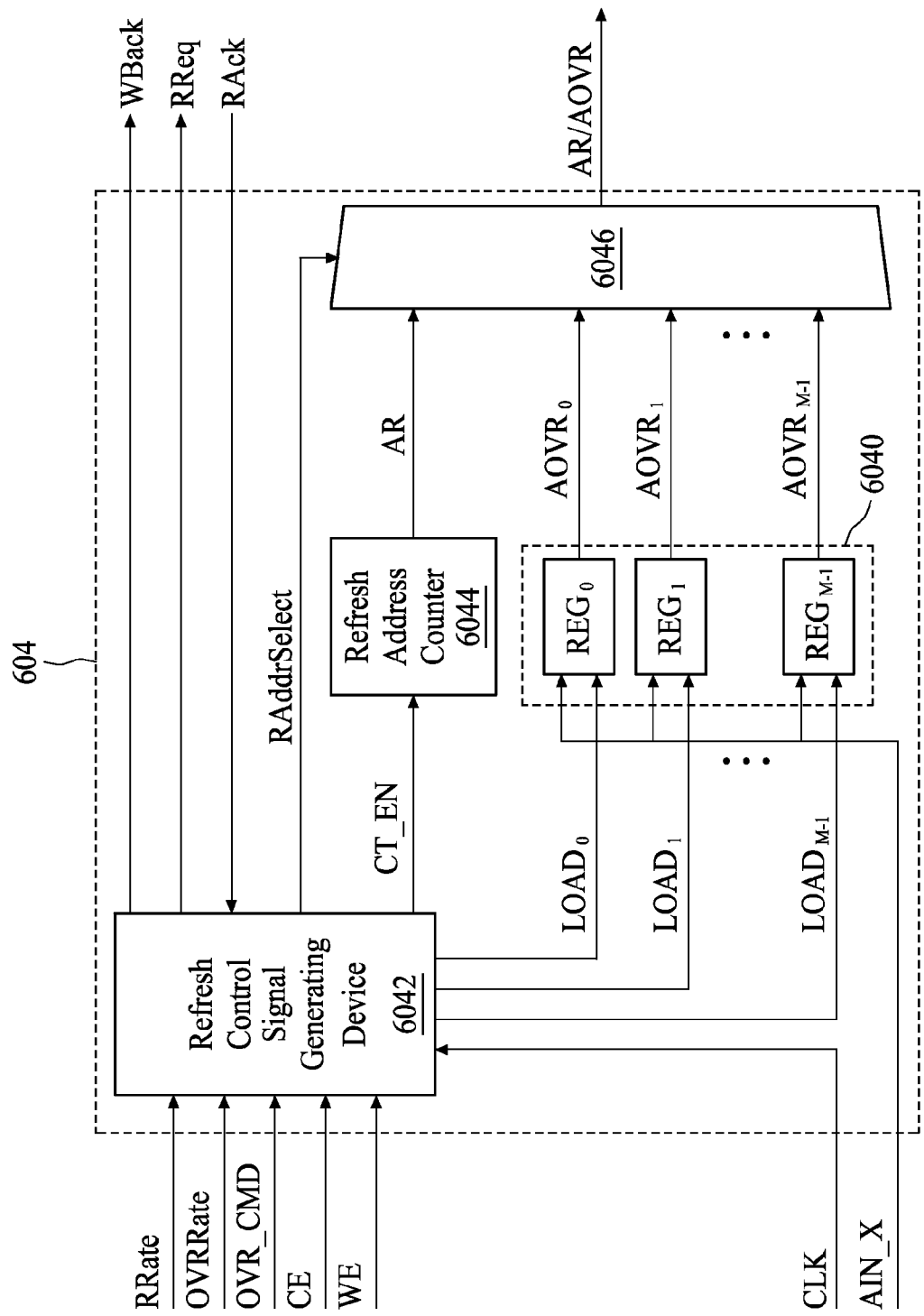
FIG. 6A is a block diagram of the refresh controller in the memory device of FIG. 2 in accordance with some embodiments.

FIG. 6A is a block diagram of the refresh controller 604 in the memory device 60 in FIG. 2 in accordance with some embodiments. The refresh controller 164 includes an address-extracting device 6040, which is a storage device comprising M OVR registers $REG_0, REG_1 \ldots, REG_{M-1}$, where M is a predetermined total number of OVR registers allocated for potential weak cells. M is determined based on process variations and a desired standby current. For example, when process variations are larger, it is likely that more weak cells exist and therefore M is larger. For another example, when a lower standby current is desired, the refresh rate RRate is set lower correspondingly; however, more weak cells may occur under this lower refresh rate RRate and M is therefore larger. Depending on the number of weak cells identified, the number of the OVR registers used for address extraction is lesser than or equal to M. An OVR register $REG_0, REG_1 \ldots,$ or $REG_{M-1}$ loads an input row address AIN_X of a corresponding weak cell in response to a corresponding load signal $LOAD_0, LOAD_1, \ldots,$ or $LOAD_{M-1}$. The refresh controller 604 includes a refresh control signal generating device 6042, a refresh address counter 6044, and a multiplexer 6046. The refresh control signal generating device 6042 is configured to generate a write back signal WBack based on the over-refresh command signal OVR_CMD, the chip enable signal CE and the write enable signal WE. The refresh control signal generating device 6042 is also configured to generate a refresh request signal RReq based on the clock signal CLK, the refresh rate RRate and the over-refresh rate OVRRate. Additionally, the refresh control signal generating device 6042 is also configured to generate a row address select signal RAddrSelect and a count enable signal CT_EN based on the refresh acknowledge signal RAck, the clock signal CLK and the refresh rate RRate, the over-refresh rate OVRRate, and the total number of row addresses in the memory block 612. The refresh control signal generating device 6042 is also configured to generate a load signal $LOAD_0, LOAD_1, \ldots,$ or $LOAD_{M-1}$ in response to the over-refresh command signal OVR_CMD. The refresh address counter 6044 is configured to output row addresses of the memory block 612, row-by-row, in response to the count enable signal CT_EN. The multiplexer 6046 is configured to select one row address AR, $AOVR_0, AOVR_1, \ldots,$ or $AOVR_{M-1}$ for refreshing in response to the refresh address select signal RAddrSelect.

In the embodiments in FIG. 6A, the address-extracting device 6040 is a storage device that stores the row addresses for over-refreshing and the refresh controller 604 uses the row addresses directly in alternation with the row addresses generated for regular refresh operations. In some other embodiments, the address-extracting device 6040 is a memory array where each bit in the memory array corresponds to a row in the memory block 612, respectively. A bit corresponding to a row containing a weak cell is marked while other bits are not marked. Upon identifying a marked bit in the memory array, the refresh controller 604 generates a corresponding row address for over-refreshing.

Figure 6B:
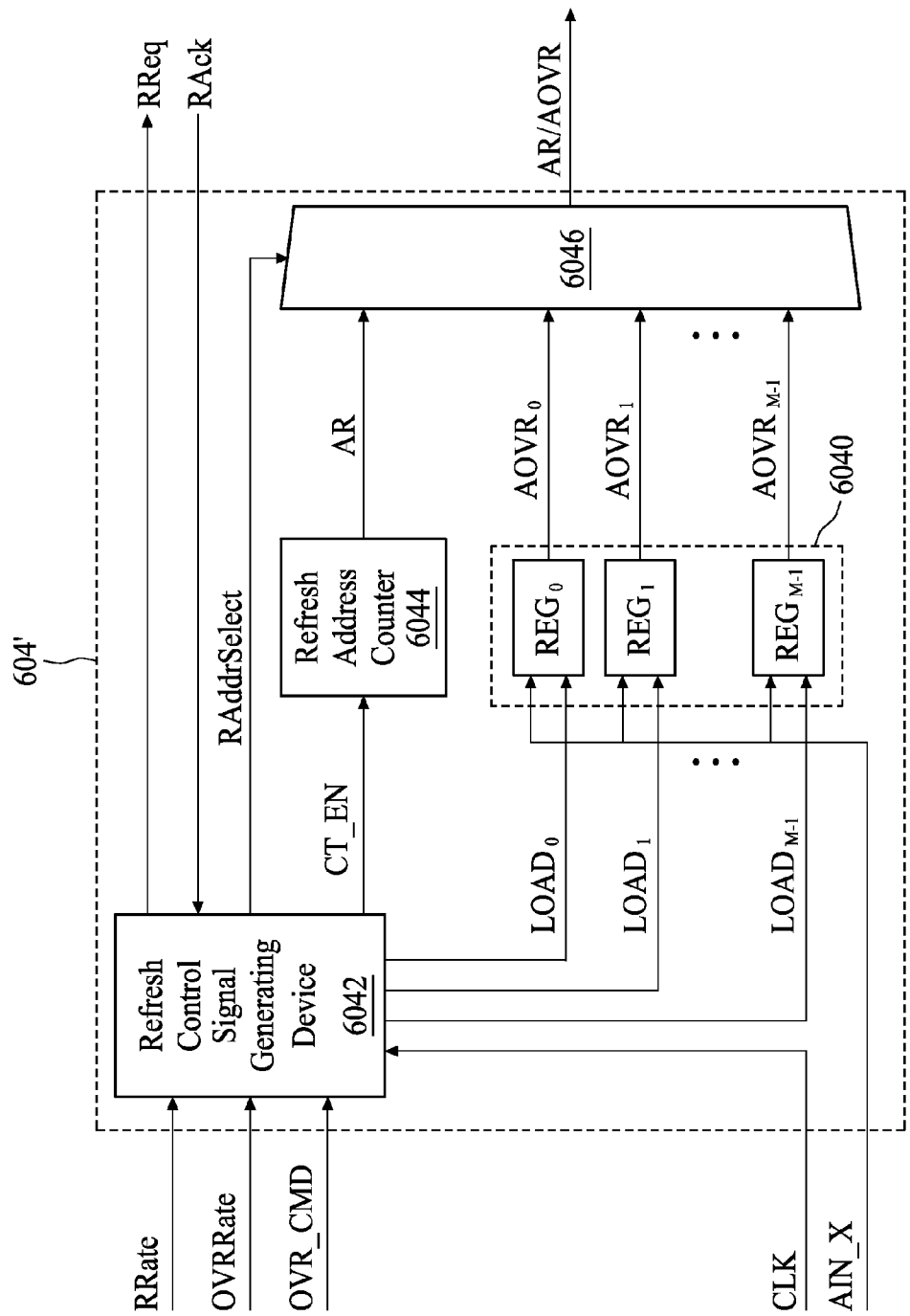
FIG. 6B is a block diagram of the refresh controller in the memory device of FIG. 4 in accordance with some embodiments.

FIG. 6B is a block diagram of the refresh controller 604' in the memory device 60' in FIG. 4 in accordance with some embodiments. Compared with the refresh controller 604 in FIG. 6A, the refresh controller 604' in FIG. 6B does not generate the write back signal WBack because, in the embodiments of FIG. 4, the error detection and correction is performed externally to the memory device 60'. Accordingly, the refresh controller 604' also does not receive the chip enable signal CE and the write enable signal WE associated with generation of the write back signal WBack.

Figure 7:
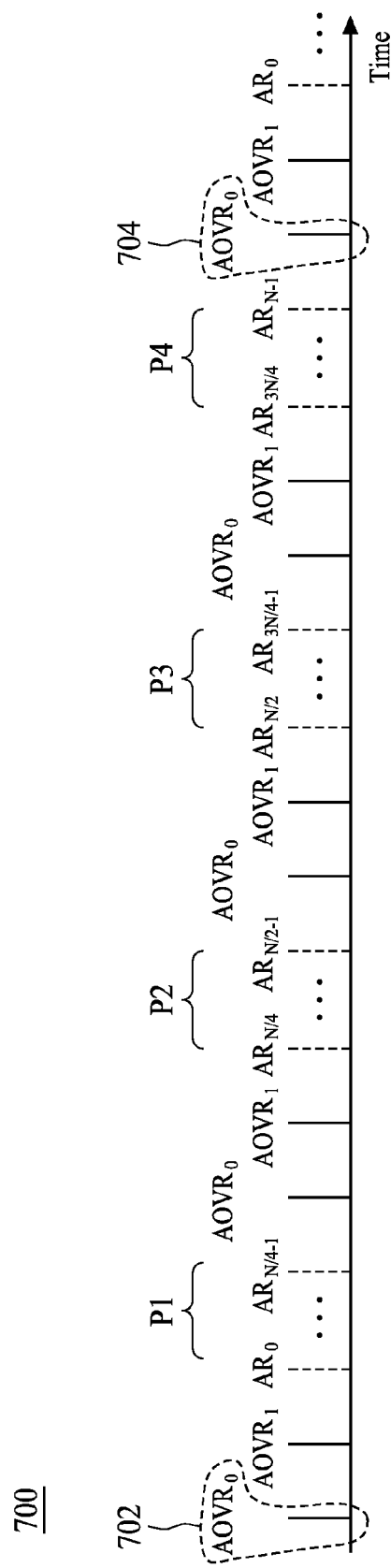
FIG. 7 is a diagram illustrating refreshing of memory cells in the memory block in accordance with some embodiments.

FIG. 7 is a diagram 700 illustrating refreshing of memory cells in the memory block 612, in accordance with some embodiments. Such refreshing includes refreshing of normal cells and refreshing of weak cells. In the illustration of FIG. 7, N rows in the memory block 612 are represented by row addresses $AR_0$ to $AR_{N-1}$ and include two rows containing weak cells and N−2 rows with normal cells. For further illustration, two weak cells are represented by row addresses $AOVR_0$ and $AOVR_1$. Effectively, two row addresses $AOVR_0$ and $AOVR_1$ of two weak cells are also contained in addresses $AR_0$ to $AR_{N-1}$. In accordance with some embodiments, the memory block 612 is refreshed row-by-row, and the addresses in FIG. 7 correspond to row addresses of the rows being refreshed.

In some embodiments, weak cells in the memory block 612 are refreshed based on the over-refresh rate OVRRate for weak cells, and are also refreshed while normal cells are being refreshed. For example, two weak cells represented by row addresses $AOVR_0$ and $AOVR_1$ are refreshed four times in a refreshing cycle beginning at a circled instance 702 and ending before a circled instance 704, and are each also refreshed while N−2 rows with normal cells are being refreshed in the same refreshing cycle. In accordance with some embodiments, the refreshing cycle includes N time periods for refreshing the N rows in accordance with the refresh rate and additional eight time periods for refreshing the 2 weak cells. In the example in FIG. 7, there are N+8 time periods between the two circled instances 702 and 704. In accordance with some embodiments, the duration of the time period is determined based on dividing a time between refreshing of the same address in accordance with the refresh rate by the number N. In accordance with some other embodiments, the duration of the time period is determined based on dividing a time between refreshing of the same address in accordance with the refresh rate by the number N+8.

The horizontal line of diagram 700 is a time axis indicating refreshing is performed over time. Two weak cells represented by addresses row $AOVR_0$ and $AOVR_1$ are refreshed in accordance with the over-refresh rate OVRRate, which, in the illustration of FIG. 7, is four times bigger than refresh rate for normal cells. N rows represented by addresses $AR_0$ to $AR_{N-1}$ are refreshed once every refreshing cycle.

As illustratively shown in diagram 700, the N rows having addresses $AR_0$ to $AR_{N-1}$ are divided into four address portions P1, P2, P3, and P4, based on the over-refresh rate OVRRate of four. In some embodiments as illustratively shown in FIG. 7, the four address portions P1, P2, P3 and P4 have the same number of row addresses. Alternatively, the four address portions P1, P2, P3 and P4 have different number of row addresses. Address portions P1, P2, P3, and P4 include addresses $AR_0$ to $AR_{N/4-1}$, $AR_{N/4}$ to $AR_{N/2-1}$, $AR_{N/2}$ to $AR_{3/4N-1}$, and $AR_{3/4N}$ to $AR_{N-1}$, respectively. Along with the first address portion P1, the two rows containing weak cells with addresses $AOVR_0$ and $AOVR_1$ are refreshed. In the first address portion P1, the rows having addresses $AR_0$ to $AR_{N/4-1}$ are refreshed. Along with the second address portion P2, the two weak cells are refreshed again. In the second address portion P2, the rows having addresses $AR_{N/4}$ to $AR_{N/2-1}$ are refreshed. Along with the third address portion P3, the two rows containing weak cells are refreshed again. In the third address portion P3, the rows having addresses $AR_{N/2}$ to $AR_{3N/4-1}$ are refreshed. Along with the fourth address portion P4, the two rows containing weak cells are refreshed again. In the fourth address portion P4, the rows having addresses $AR_{N/4}$ to $AR_{N/2-1}$ are refreshed. As indicated above, because two row addresses $AOVR_0$ and $AOVR_1$ of the two rows containing weak cells are contained in addresses $AR_0$ to $AR_{N-1}$, the two weak cells are also refreshed while the N rows having addresses $AR_0$ to $AR_{N-1}$ are being refreshed.

Four times to refresh weak cells in a refreshing cycle are used for illustration. Another number of times to refresh weak cells in a refreshing cycle is within the contemplated scope of the present disclosure. Two weak cells are also used for illustration. Another number of weak cells is also within the contemplated scope of the present disclosure.

Corresponding to the circuits in FIGS. 6A and 6B, the multiplexer 6046 selects a row address from the refresh address counter 6044 when a cell having a row address in row addresses $AR_0$ to $AR_{N-1}$ is refreshed. In contrast, the multiplexer 6046 selects a row address from the address-extracting device 6040 when a weak cell having a row address in row addresses $AOVR_0$ and $AOVR_1$ is refreshed. The refresh address counter 6044 increments at each instance of addresses $AR_0$ to $AR_{N-1}$ and resets after the total number of rows in the memory block 612 is refreshed. Alternatively, the refresh address counter 6044 may count down instead of counting up.

Method Embodiments

Figure 8:
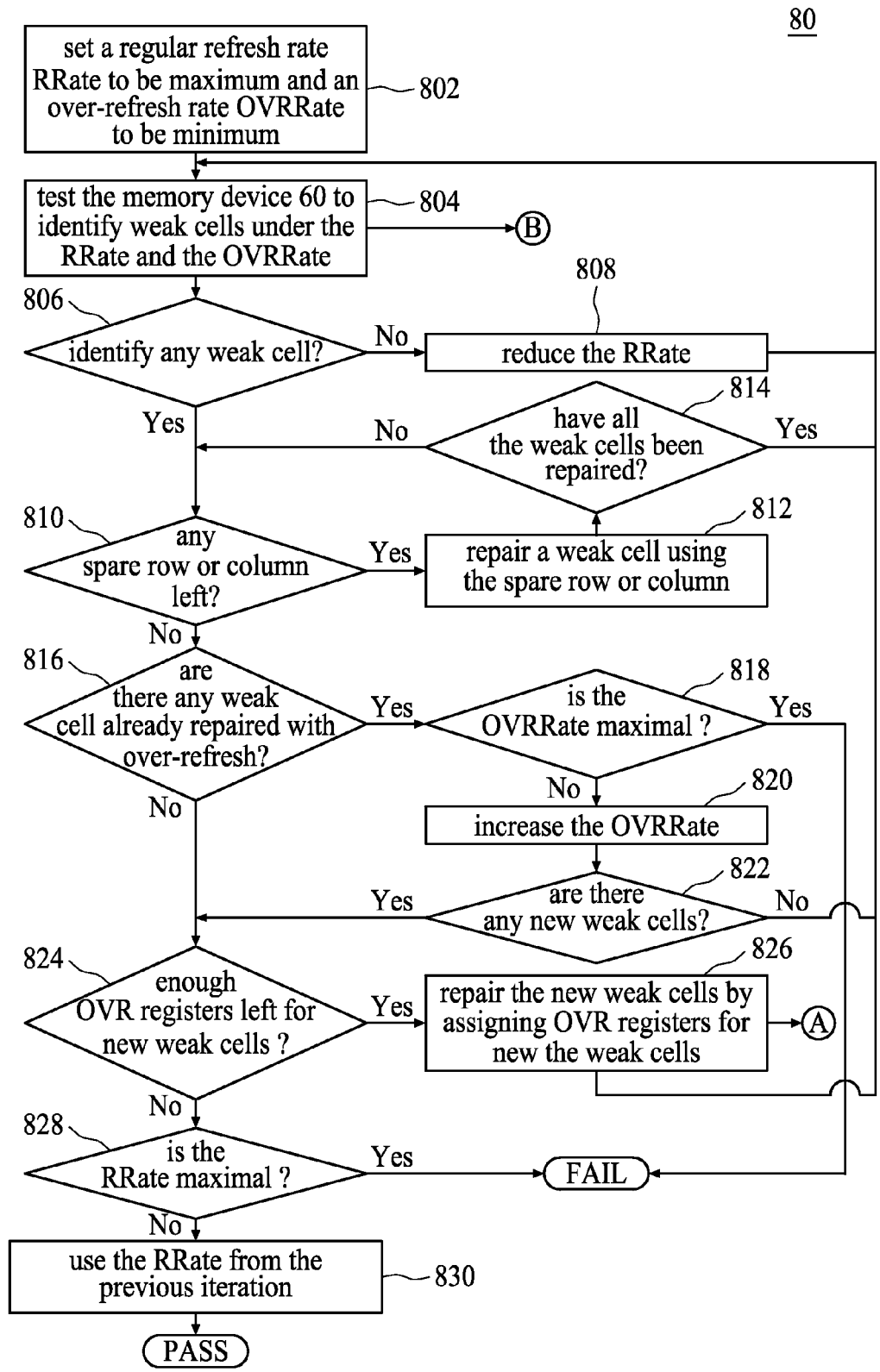
FIG. 8 is a flow chart illustrating a testing method performed by the BISTR device in accordance with some embodiments.

FIG. 8 is a flow chart illustrating a testing method 80 performed by the BISTR device 30 in FIG. 1 in accordance with some embodiments. The testing method 80 is performed to find a minimal refresh rate RRate that can be used for the memory device 60 in FIG. 1 while repairing weak cells under this refresh rate RRate using spare rows and columns or over-refresh, so that power dissipation of the memory device 60 may be reduced.

In operation 802, a regular refresh rate RRate is set to be a maximum value specified in a specification for the memory device 60 and an over-refresh rate OVRRate is set to be a minimum value specified in the specification for the memory device 60.

In operation 804, the memory device 60 is tested to identify weak cells under the refresh rate RRate and the over-refresh rate OVRRate set in operation 802. The cells that successfully retain data under the refresh rate RRate are normal cells and the cells that fail retaining data under the refresh rate RRate are weak cells.

In operation 806, if any weak cell is identified, then the method continues to operation 810. Otherwise, the refresh rate RRate is reduced in operation 808 and the method loops back to test the memory device 60 again in operation 804 to determine if there are new weak cells that fail data retention under this reduced refresh rate RRate.

In operation 810, if a spare row or column is available to repair the weak cell, the weak cell is repaired using the spare row or column in operation 812. Otherwise, the method 80 continues to operation 816.

If all the weak cells have been repaired using spare rows and columns in operation 814, the method 80 loops back to test the memory device 60 again in operation 804 to determine if the repaired weak cells successfully retain data. Otherwise, the availability of a spare row or column is checked again in operation 810.

In operation 816, if there are weak cells already repaired with over-refreshing in previous iterations, whether the over-refresh rate OVRRate has reached a maximum value specified by the specification of the memory device 60 is checked in operation 818. Otherwise, the method 80 continues to operation 824.

In operation 818, if the over-refresh rate OVRRate is not maximal, the over-refresh rate OVRRate is increased in operation 820. Otherwise, the memory device 60 is determined to have failed the test. After the over-refresh rate OVRRate is increased in operation 820, whether there are new weak cells that are not already repaired with over-refreshing in the previous iterations is checked in operation 822. If so, the method 80 continues to operation 824. Otherwise, the method 80 loops back to test the memory device 60 again in operation 804 to determine if the repaired weak cells successfully retain data.

In operation 824, if there are enough OVR registers left for new weak cells that are not repaired with over-refreshing in the previous iterations, the new weak cells are repaired by assigning OVR registers for the new weak cells, and the method 80 loops back to test the memory device 60 again in operation 804 to determine if the repaired weak cells successfully retain data. If there are not enough OVR registers left for new weak cells in operation 824, the method continues to operation 828 to check if the refresh rate RRate is maximal. If so, the memory device 60 is determined to have failed the test, and if not, the refresh rate RRate from the previous iteration is used in operation 830, and the memory device 60 is determined to have passed the test. The memory device 60 determined to have failed the test is considered irreparable and non-functional. The memory device 60 determined to have passed the test is considered functional under the refresh rate RRate and the over-refresh rate OVRRate.

In FIG. 8, the circled A and B represent that after the corresponding operations 804 and 826 are performed by the BISTR device 30 in FIG. 1, the memory device 60 or 60' in FIG. 2 or FIG. 4 acts correspondingly.

Figure 9:
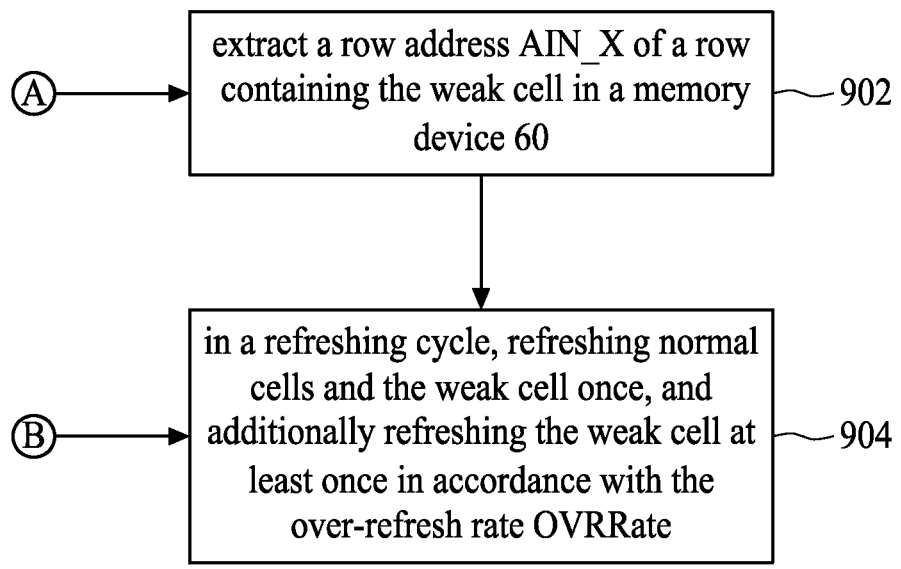
FIG. 9 is a flow chart illustrating a refreshing method performed by the memory device in accordance with some embodiments.

FIG. 9 is a flow chart illustrating a refreshing method 90 performed by the memory device 60, in accordance with some embodiments. The memory device 60 is used for illustration. The method is also applicable to the memory device 60'. In FIG. 9, the circled A and B represent that operations 902 and 904 are some acts of the memory device 60 in response to operations 826 and 804 in FIG. 8, respectively.

In operation 902, the memory device 60 extracts a row address AIN_X of a row containing the weak cell in the memory device 60.

In operation 904, in a refreshing cycle, the memory device 60 performs refreshing normal cells and the weak cell once, and additionally refreshing the weak cell at least once in accordance with the over-refresh rate OVRRate. In the illustration of FIG. 9, one weak cell is refreshed additionally in the refreshing cycle for illustration. However, depending on the number of weak cells identified, the number of weak cells in the steps 902 and 904 can be correspondingly increased. For example, in FIG. 7, the set of rows include N rows with addresses $AR_0$ to $AR_{N-1}$, wherein 2 rows out of the N rows include weak cells and the other N−2 rows include normal cells. The addresses $AOVR_0$ and $AOVR_1$ of the rows containing the weak cells are extracted. The N−2 rows with normal cells and the 2 rows with the weak cells are refreshed once in the refreshing cycle, and the 2 rows with the weak cells are refreshed four times in the refreshing cycle.

Figure 10:
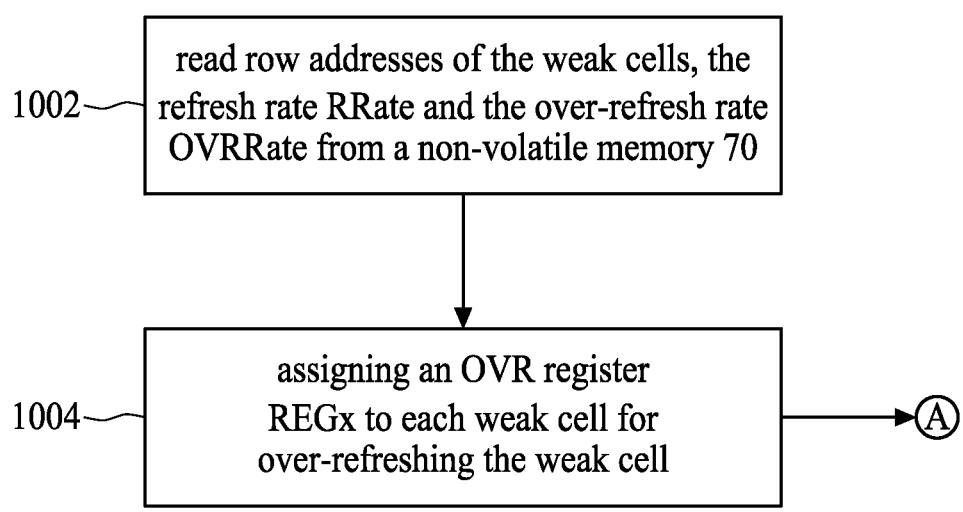
FIG. 10 is a flow chart illustrating a repairing method performed by the BISTR device each time after a memory device is powered up and before operation of the memory device in accordance with some embodiments.

FIG. 10 is a flow chart illustrating a repairing method 100 performed by the BISTR device 30 in FIG. 1 each time after a memory device 60 is powered up and before operation of the memory device 60 in accordance with an embodiment.

In operation 1002, row addresses of the weak cells, the refresh rate RRate and the over-refresh rate OVRRate are read from the non-volatile memory 70.

In operation 1004, an over-refresh register REGx is assigned to each weak cell for over-refreshing the weak cell. Similar to FIG. 8, the circled A indicates a correspondence between operation 1004 in FIG. 10 performed by the BISTR device 30 and operation 902 in FIG. 9 performed by the memory device 60.

Figure 11:
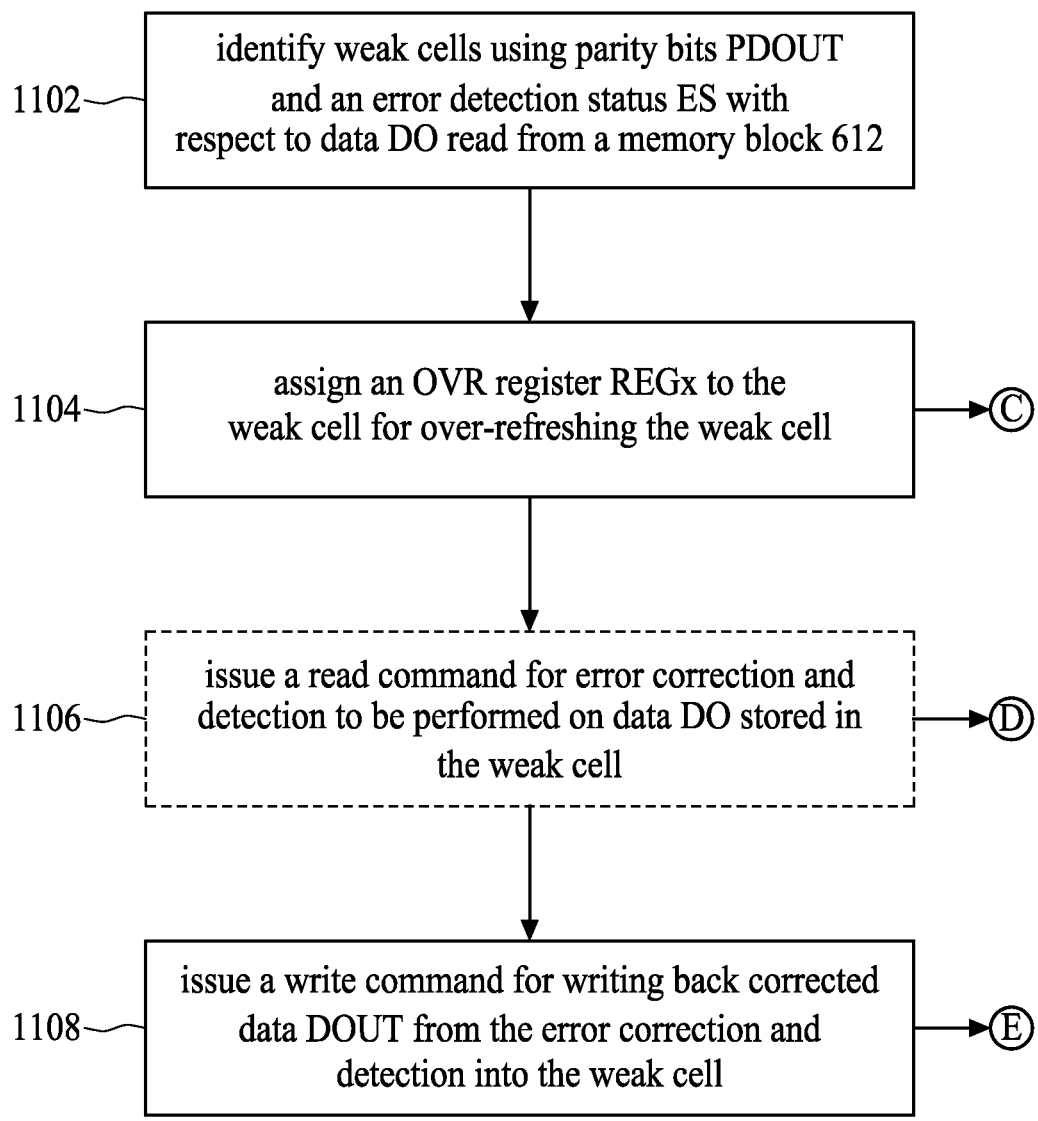
FIG. 11 is a flow chart illustrating an in-field repair method performed by the system controller in accordance with some embodiments.

FIG. 11 is a flow chart illustrating an in-field repair method 110 performed by the system controller 10 in FIG. 1 in accordance with some embodiments.

In operation 1102, a weak cell is identified using parity bits PDOUT and a result of error detection and correction (e.g., an error detection status ES) with respect to output data DO read from a memory block 612 in FIG. 2. In various embodiments in FIG. 4, a weak cell is identified using the parity bits PDOUT with respect to output data DOUT read from a memory block 612 in FIG. 4 and an error detection status ES available in the system controller 10 in FIG. 1. The error detection status ES reflects whether any error exists in the output data DO or DOUT. With such information, errors in the output data DO or DOUT are corrected and addresses where the errors occur are identified as addresses of the weak cells.

In operation 1104, an OVR register $REG_X$ is assigned to the weak cell for over-refreshing the weak cell. In operation 1106, a read command is issued, using the chip enable signal CE and write enable signal WE in FIGS. 2 and 3, for the error detection and correction to be performed on data DO stored in the weak cell. The box enclosing the operation 1106 is dotted to show that this operation may be omitted if the error detection and correction is performed externally to the memory device 60' as in the embodiment shown in FIG. 4.

In operation 1108, a write command is issued, using the chip enable signal CE and write enable signal WE, for writing back corrected data DOUT from the error detection and correction into the weak cell. The operation 1104 may be performed in the same clock cycle as the operation 1106 or 1108.

Figure 12:
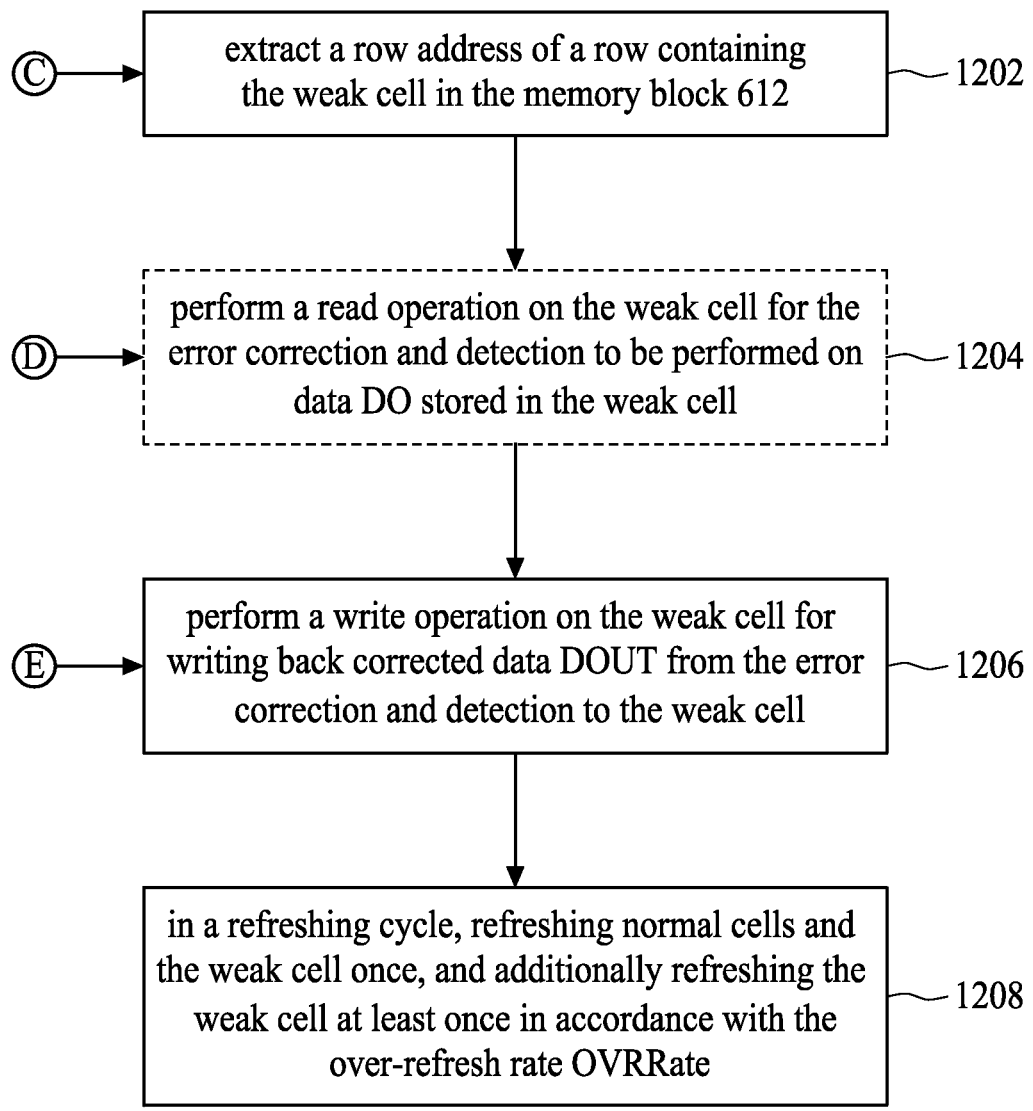
FIG. 12 is a flow chart illustrating an in-field repair and refreshing method performed by the memory device in accordance with some embodiments.

FIG. 12 is a flow chart illustrating an in-field repair and refreshing method 120 performed by the memory device 60 in FIG. 2 in accordance with some embodiments. The memory device 60 is used for illustration. The method is also applicable to the memory device 60'. The circled C, D and E represent that the operations 1202, 1204 and 1206 are performed by the memory device 60 in response to the operations 1104, 1106 and 1108 in FIG. 11, respectively, that are performed by the system controller 10.

In operation 1202, a row address of a row containing the weak cell in the memory block 612 is extracted.

In operation 1204, a read operation is performed on the weak cell for the error detection and correction to be performed on the data DO stored in the weak cell.

In operation 1206, a write operation is performed on the weak cell for writing corrected data DOUT) from the error detection and correction back to the weak cell.

In operation 1208, in a refreshing cycle, normal cells and the weak cell of the memory block 612 are refreshed once, and the weak cell is additionally refreshed at least once in accordance with the over-refresh rate OVRRate. In the illustration in FIG. 12, one weak cell is refreshed additionally in the refreshing cycle for illustration. However, depending on the number of weak cells identified, the number of weak cells in the steps 1202 to 1208 can be correspondingly increased. For example, with reference to FIG. 7, the set of rows include N rows with addresses $AR_0$ to $AR_{N-1}$, wherein 2 out of the N rows include weak cells and the other N-2 rows include normal cells. The addresses $AOVR_0$ and $AOVR_1$ of the rows containing the weak cells are extracted. The N-2 rows with normal cells and the 2 rows with the weak cells are refreshed once in the refreshing cycle, and the 2 rows with the weak cells are refreshed four times in the refreshing cycle. The box enclosing the operation 1204 is dotted to indicate that this operation may be omitted if the error detection and correction is performed externally to the memory device 60' in FIG. 4. Moreover, the operation 1202 may be performed in the same clock cycle as the operation 1204 or 1206.

In some embodiments, in a method, in a refreshing cycle, normal cells and a weak cell in a memory device are refreshed. In the refreshing cycle, the weak cell is additionally refreshed at least once.

In some embodiments, a memory device includes a memory block and a refresh controller. The memory block includes a weak cell. The refresh controller is configured for the memory block to be refreshed once in a refreshing cycle, and for the memory block to be additionally refreshed at least once in the refreshing cycle.

In some embodiments, in a method, a refresh rate is set. A memory device is caused to refresh at the refresh rate. If a weak cell fails to retain data under the refresh rate, in a refreshing cycle, the memory device is caused to refresh normal cells and the weak cell, and to additionally refresh the weak cell at least once. Further, if the weak cell successfully retains data, the refresh rate is reduced.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A method, comprising:
performing error detection and correction on output data from a memory cell of a memory device to generate a result of error detection and correction;
determining the memory cell as a weak cell in response to a predetermined number of times of data retention failures of the memory cell based on the result of the error detection and correction;
in a first clock cycle, reading data stored in the weak cell based on a first address of the weak cell provided by a system controller;
performing error detection and correction on the data to obtain error corrected data;
in a second clock cycle, writing the error corrected data into the weak cell based on the first address; and
in a refreshing cycle,
refreshing normal cells and the weak cell of the memory device based on a plurality of corresponding second addresses of the normal cells and the weak cell provided by a refresh controller; and
additionally refreshing the weak cell at least once based on a third address of the weak cell provided by the refresh controller.

2. The method according to claim 1, wherein
the second clock cycle is consecutive to the first clock cycle.

3. The method according to claim 2, further comprising:
in one of the first clock cycle and the second clock cycle, extracting the first address to obtain the third address.

4. The method according to claim 1, wherein
the second clock cycle and the first clock cycle are separated in time.

5. The method according to claim 4, further comprising:
in the second clock cycle, extracting the first address to obtain the third address.

6. The method according to claim 1, wherein in the refreshing cycle, refreshing the normal cells and the weak cell and additionally refreshing the weak cell comprise:
based on a plurality of address portions in the plurality of second addresses, portion-by-portion, refreshing cells in each address portion along with refreshing the weak cell.

7. A system, comprising:
a memory block comprising normal cells and a weak cell;
a system controller;
an error correction code (ECC) capability; and
a refresh controller;
the system controller being configured to provide a first address of the weak cell;
the memory block being configured to read data stored in the weak cell in a first clock cycle based on the first address;
the ECC capability being configured to perform error detection and correction on the data to obtain error corrected data;
the memory block being further configured to write the error corrected data into the weak cell in a second clock cycle based on the first address; and
the refresh controller being configured to provide a plurality of corresponding second addresses of the normal cells and the weak cell based on which the normal cells and the weak cell are refreshed once in a refreshing cycle, and to provide a third address of the weak cell based on which the weak cell is additionally refreshed at least once in the refreshing cycle.

8. The system according to claim 7, wherein
the second clock cycle is consecutive to the first clock cycle.

9. The system according to claim 8, wherein
the refresh controller comprises an address-extracting device configured to extract the first address in response to an assertion of a signal; and
the signal is asserted in the first clock cycle or the second clock cycle.

10. The system according to claim 7, wherein
the second clock cycle and the first clock cycle are separated in time.

11. The system according to claim 10, wherein
the refresh controller comprises an address-extracting device configured to extract the first address in response to an assertion of a signal; and
the signal is asserted in the second clock cycle.

12. The system according to claim 7, wherein the refresh controller further comprises:
a refresh address counter configured to output the plurality of second addresses in the refreshing cycle;
an address-extracting device configured to extract the first address to obtain the third address;
a multiplexer configured to select one address of the plurality of second addresses from the refresh address counter or the third address from the address-extracting device for refreshing,
wherein
the refresh controller controls the multiplexer and the refresh address counter such that the multiplexer selects the address-extracting device at least once in the refreshing cycle.

13. The system according to claim 12, wherein the refresh controller is configured to control the refresh address counter and the multiplexer such that based on a plurality of address portions in the plurality of second addresses, portion-by-portion, the multiplexer selects the refresh address counter to output addresses of each address portion, and selects the address-extracting device to output the third address.

14. A method, comprising:
in a first clock cycle, reading data stored in a weak cell of a memory device based on a first address of the weak cell provided by a system controller;
performing error detection and correction on the data to obtain error corrected data;
in a second clock cycle, writing the error corrected data into the weak cell based on the first address; and
in a refreshing cycle,
refreshing normal cells and the weak cell of the memory device based on a plurality of corresponding second addresses of the normal cells and the weak cell provided by a refresh controller; and
additionally refreshing the weak cell at least once based on a third address of the weak cell provided by the refresh controller.

15. The method according to claim 14, wherein
the second clock cycle is consecutive to the first clock cycle.

16. The method according to claim 15, further comprising:
in one of the first clock cycle and the second clock cycle, extracting the first address to obtain the third address.

17. The method according to claim 14, wherein
the second clock cycle and the first clock cycle are separated in time.

18. The method according to claim 17, further comprising:
in the second clock cycle, extracting the first address to obtain the third address.

* * * * *